US007675135B2

(12) United States Patent
Patti et al.

(10) Patent No.: US 7,675,135 B2
(45) Date of Patent: Mar. 9, 2010

(54) INTEGRATED HIGH VOLTAGE POWER DEVICE HAVING AN EDGE TERMINATION OF ENHANCED EFFECTIVENESS

(75) Inventors: Davide Patti, Catania (IT); Giuditta Settanni, Catania (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 171 days.

(21) Appl. No.: 11/575,227

(22) PCT Filed: Sep. 12, 2005

(86) PCT No.: PCT/IT2005/000515

§ 371 (c)(1), (2), (4) Date: Feb. 6, 2008

(87) PCT Pub. No.: WO2006/030467

PCT Pub. Date: Mar. 23, 2006

(65) Prior Publication Data

US 2008/0237773 A1 Oct. 2, 2008

(30) Foreign Application Priority Data

Sep. 14, 2004 (EP) ................................ 04425681

(51) Int. Cl.
*H01L 23/58* (2006.01)

(52) U.S. Cl. ....................... 257/490; 257/487; 257/491; 257/E29.109; 257/E21.335; 257/E29.013

(58) Field of Classification Search ......... 257/490–495, 257/E29.109, E21.335, E29.013
See application file for complete search history.

(56) References Cited

U.S. PATENT DOCUMENTS

| | | | | |
|---|---|---|---|---|
| 4,667,393 | A | 5/1987 | Ferla et al. | 29/576 B |
| 6,153,916 | A * | 11/2000 | Roth et al. | 257/409 |
| 6,441,455 | B1 * | 8/2002 | Dutta | 257/490 |
| 6,603,153 | B2 * | 8/2003 | Francis et al. | 257/104 |
| 2002/0017647 | A1 | 2/2002 | Bakowski et al. | 257/77 |

FOREIGN PATENT DOCUMENTS

| | | | |
|---|---|---|---|
| EP | 0 632 502 | A | 1/1995 |
| EP | 632502 | A1 * | 1/1995 |
| EP | 0 637 846 | A | 2/1995 |
| EP | 637846 | A2 * | 2/1995 |

* cited by examiner

*Primary Examiner*—Fernando L Toledo
*Assistant Examiner*—Mamadou Diallo
(74) *Attorney, Agent, or Firm*—Lisa K. Jorgenson; Allen, Dyer, Doppelt, Milbrath & Gilchrist, P.A.

(57) ABSTRACT

Instabilities and related drawbacks that arise when interruptions of a perimetral high voltage ring extension implanted regions (RHV) of a main junction (P_tub 1, (P_tub2, . . . ) of an integrated device must be realized may be effectively prevented. This important result is achieved by an extremely simple expedient: whenever an interruption (I) of the high voltage ring extension must be created, it is not realized straight across it along a common orthogonal direction to the perimetral implanted region, on the contrary, the narrow interruption is defined obliquely or slantingly across the width of the perimetral high voltage ring extension. In case of a straight interruption, the angle of slant (α) may be generally comprises between 30 and 60 degrees and more preferably is 45 degrees or close to it. Naturally, the narrow interruption is created by masking it from dopant implantation when realizing the perimetral high voltage ring extension region.

20 Claims, 1 Drawing Sheet

INTEGRATED HIGH VOLTAGE POWER DEVICE HAVING AN EDGE TERMINATION OF ENHANCED EFFECTIVENESS

FIELD OF THE INVENTION

The present invention relates in general to integrated devices including power transistors of either bipolar junction or MOS type and more in particular to their edge terminations for enhancing the high voltage breakdown characteristics of the integrated device.

DISCUSSION OF THE PRIOR ART

When integrating power devices destined to function at relatively high voltages, it is imperative to ensure an adequately high breakdown voltage of main junctions of the integrated device, for example the base-collector P-N junction of a power bipolar junction transistor (BJT) or the body-drain junction of a power MOS. This is done by realizing an appropriate edge termination or edge structure capable of reducing the effects of the curvature of these junctions at risk around the perimeter of the integrated structure which generally coincide with the edges of the semiconducting chip. As it is well known to a skilled designer, an appropriate edge termination may achieve an effectiveness close to perfection, that is it may ensure a breakdown voltage BV of the device practically coincident or close to the theoretical BV of an infinite planar parallel junction.

According to a well known approach, the edge termination relies on the extension of the main junction by forming, by ion implantation, a continuous annular extension of the main junction, commonly referred to as high voltage ring (briefly RHV) around the perimeter of the integrated device structure or for a substantial portion of the perimeter.

According to common fabrication technologies, such an extension of the main junction is formed along the perimeter of the active area occupied by an integrated power transistor and generally also by control circuitry integrated on the same chip, by introducing, by ion implantation techniques, a controlled dose of dopant such as to realize a ring-like implanted extension region electrically connected to a main junction, for example to the current terminal (collector or drain) of an integrated device, represented by a diffused region (for example a $P_{13}$tub diffusion) in the epitaxial layer (EPI) grown on a semiconducting substrate.

The partial cross-sectional view of FIG. 1 depicts a typical edge termination of an integrated power BJT.

In this way, upon an increase of the voltage applied to the substrate, the region of the high voltage ring RHV extension of the main junction (P_tub) is completely depleted and the potential distributes itself at the surface along the whole length of the high voltage RHV extension with a consequent reduction of the effects of the edge curvature of the main junction as well as of the intensity of the electric field at the surface.

By virtue of this "spreading" mechanism implemented by realizing the high voltage ring extension RHV, the device may reach a breakdown voltage close to the limit case of an infinite planar parallel junction, that is an almost hundred percent effectiveness.

In such an edge termination structure including the presence of a high voltage ring extension RHV of the main junction along the whole or at least part of the perimeter of the integrated structure of a power transistor, the implanted high voltage ring RHV region physically encroaches the main diffusion (e.g. the collector or the drain) of the power transistor. In other words the implant mask for the RHV extension region defines an implant window that partially overlaps the main diffusion.

In reality, the layout of an integrated circuit may comprise more integrated power transistors along with a control region containing signal processing circuitries. In general, there may be several distinct diffusions of the same type of conductivity, that is forming main junctions that may risk breakdown in case of excessively high voltage that could be applied to the main junction through the semiconducting substrate, juxtaposed one to the other and separated by the generally lightly doped region of opposite type of conductivity that commonly is the epitaxially grown layer formed on the semiconducting crystal substrate.

These distinct main diffusions of the same type may generally assume different voltages during operation of the integrated device. In these cases, it is necessary to interrupt the continuity of the high voltage ring extension RHV, by defining in the RHV implant mask a narrow interruption I of the perimetral or ring implanted region diffusion over the lightly doped region of separation between distinct diffusions of the same type likely to assume different voltages, as depicted in FIG. 2.

Of course, the need to realize these necessary narrow interruptions of the continuity of the would-be continuous implanted high voltage ring extension region may determine a sensitivity of the edge termination structure to the presence of electrical charges in the dielectric layers present over the perimetral portion of the mono-crystalline silicon chip coinciding with at least part of the perimeter of an integrated power device, leading to an instability ("walk in/walk out") of the breakdown voltage.

On another account, such necessary narrow interruptions of the continuity of the dopant implanted high voltage ring extension must be dimensioned such that for a given expected voltage difference between distinct main diffusions of same type of conductivity separated by a lightly doped epitaxial region of opposite type of conductivity, and down to an established maximum reverse voltage that may be applied to such main junctions, the diffusions remain effectively isolated from one another, that is any passage of current by punch-through through the bridging parasitic transistor along the implanted high voltage ring extension of the diffusions is effectively prevented.

While during normal operating voltages the interruption of the continuity of the implanted extension region RHV prevent such a flow of current from one diffusion to the neighboring one, in terms of breakdown voltage characteristic, once a certain reverse voltage applied to the main junction is exceeded and even more so upon approaching the breakdown voltage, the widening of the depleted region renders relatively neglectable the physical interruption of the high voltage ring extension, which results in practice in it behaving as if electrically continuous, notwithstanding the presence of a narrow interruption.

SUMMARY OF THE INVENTION

An effective way of overcoming the noted instabilities of the breakdown voltage that are likely to occur in presence of narrow interruptions of the implanted high voltage ring extension has now been found.

According to this invention, it has been found that the instabilities and related drawbacks that arise when interruptions of the perimetral high voltage ring extension must be realized may be effectively prevented.

This important result is achieved by an extremely simple expedient: whenever an interruption of the high voltage ring extension must be created, it is not realized straight across it along a common orthogonal direction to the perimetral implanted region, on the contrary, the narrow interruption is defined obliquely or slantingly across the width of the perimetral high voltage ring extension. In case of a straight interruption, the angle of slant may be generally comprised between 30 and 60 degrees and more preferably is 45 degrees or close to it. Naturally, the narrow interruption is created by masking it from dopant implantation when realizing the perimetral high voltage ring extension region.

It has been demonstrated that by realizing, where required, a slanting narrow interruption across the width of the high voltage ring implanted region, instead of a straight across orthogonal interruption as it is commonly done according to the prior art, conditions are created by virtue of which in correspondence of the interruption the equipotential lines lie in a region, the average dopant concentration of which can be considered in practice much closer to the dopant concentration of the high voltage ring diffusion than in the case of a straight across, orthogonal interruption where the equipotential lines lie in a region of relatively low dopant concentration (typically in the epitaxial region EPI).

By so doing, the electrical conditions that would be determined by the presence of an uninterrupted high voltage ring extension are more closely reproduced, notwithstanding the physical interruption in the continuity of the high voltage ring extension, because of the above-discussed reasons.

DESCRIPTION OF AN EMBODIMENT OF THE INVENTION

Figure 3:
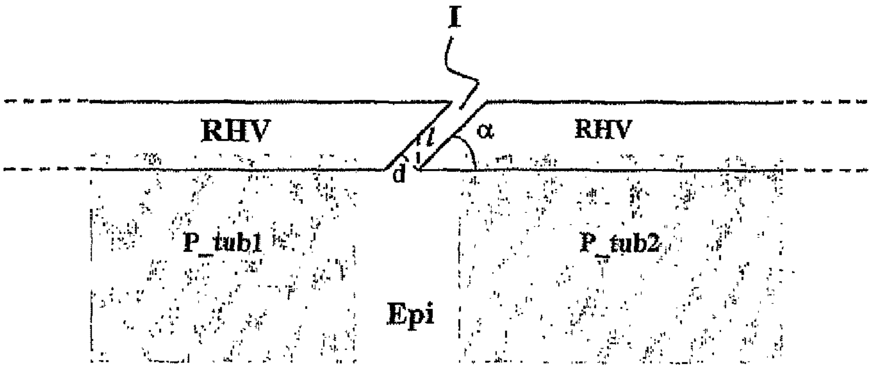
FIG. 3 is a detail layout view of a physical interruption created in the implanted high voltage ring extension region, according to the present invention.

With reference to FIG. 3, the narrow interruption I of an implanted high voltage ring extension RHV of an edge termination structure of an integrated device is provided, in order to prevent flow of current from one main diffusion, P_tub1, to another juxtaposed main diffusion of the same type, P_tub2, of the integrated device.

Figure 1:
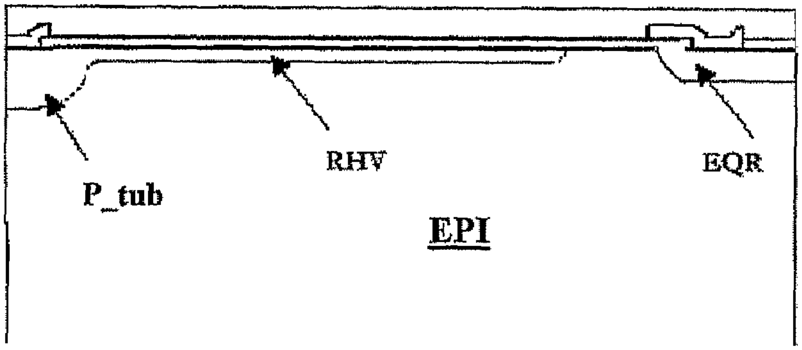
FIG. 1 shows a partial cross-section of a typical edge termination of a device comprising an integrated power transistor structure as in the prior art discussed above.
Figure 2:
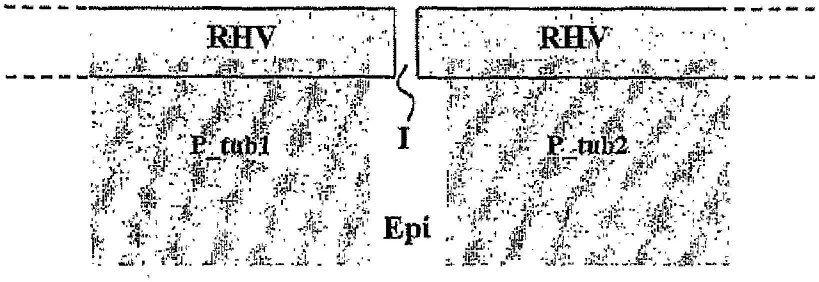
FIG. 2 is a detail layout view of a physical interruption of the implanted high voltage ring extension region of main diffusions to prevent a flow of current from one diffusion to another juxtaposed main diffusion of the same type of the integrated device, according to known art.

As observed by comparing the prior art layout of FIG. 2 with the novel layout of FIG. 3, the narrow interruption I is defined substantially obliquely to the longitudinal direction of the high voltage ring extension RHV.

Similarly to the common practice represented in FIG. 2, the interruption I of the implanted perimetral RHV region is realized in correspondence of the epitaxial layer region EPI of separation between the two main diffusions P_tub1 and P_tub2, one of which may belong or constitute an epitaxial collector or drain region of a power transistor and the other belong to a region of control circuitry, and which may, during operation, be at different potentials.

In these situations, it is imperative to interrupt the perimetral high voltage ring extension RHV that merges with both distinct diffusions, P_tub1 and P_tub2, by determining in practice the presence of narrow EPI channel across the width of the perimetral high voltage diffusion RHV.

Of course, the narrow interruption I must be wide enough to ensure that the distinct diffusions: $P_{13}$tub1 and P_tub2, remain electrically isolated up to a nominal maximum difference of voltage between them and up to a certain reverse voltage, during normal functioning conditions of the device, such that the flow of current through the RHV region from one main diffusion to the other by punch- through of the parasitic PNP transistor that is created in case of the illustrated example, be prevented.

By contrast, under breakdown conditions, as already noted that is, once a certain maximum admissible reverse voltage is exceeded, the broadening of the depletion region makes in fact the doped high voltage ring extension RHV behave as if there were no interruptions along it.

In the sample embodiment shown in FIG. 3, the interruption I is defined with an angle of inclination $\alpha$ of about 45°.

As may be readily noted, by comparing the prior art layout of the narrow interruption I of the RHV extension of FIG. 2 with the layout of a functionally similar interruption I made according to the present invention of FIG. 3, under breakdown conditions, the equipotential lines that in case of the prior art layout of the interruption I extend in the EPI channel of separation between the juxtaposed ends of the annular high voltage ring doped extension RHV for the whole width of the perimetral RHV extension region, in the case of the layout of interruption of the present invention, the equipotential lines extend in the EPI channel for a length that is considerably less than the whole width of the RHV diffusion, approximately for a length $l=d/\cos\alpha$.

In this way, even if one or more interruptions of the perimetral RHV extension need to be formed, the electrical behavior of a continuous RHV extension are more closely reproduced. This effectively prevents the observed decline of effectiveness of the so interrupted RHV extension under breakdown conditions.

Notwithstanding the fact that the illustrated embodiment shows a slanting of the narrow interruption I of the perimetral RHV extension by an angle of about 45°, practically similar results can be obtained also with angles of inclination different from 45°. Generally, any angle comprised between 30° and 60° produces evident improvements.

Of course, any comparable slanting of the interruption I, even if not along a straight line but slightly curved, would equally be effective in preserving a good effectiveness of the edge termination under breakdown conditions while ensuring in any case an electrical isolation of distinct junctions under normal working conditions.

The invention claimed is:

1. An integrated device comprising:

at least one power transistor having a first diffusion defining a first diffusion junction;

an edge termination including a high voltage ring extension implanted region partially overlapping said first diffusion and extending along at least part of a perimeter of the integrated device; and at least one second diffusion of a same type as said first diffusion also partially overlapped by said high voltage ring extension implanted region;

said high voltage ring extension implanted region having at least one interruption therein being slanted from orthogonal to said high voltage ring extension implanted region for preserving effectiveness of said edge termination under breakdown voltage conditions.

2. The integrated device according to claim 1 wherein said at least one interruption is slanted by an angle between 30° and 60°.

3. The integrated device according to claim 1 wherein said at least one interruption is slanted by an angle of 45°.

4. The integrated device according to claim 1 further comprising a monocrystalline semiconductor substrate and an epitaxial layer thereon defining a region of lesser dopant within said at least one interruption.

5. The integrated device according to claim 1 wherein said first diffusion junction comprises a base-collector junction of a bipolar junction power transistor.

6. The integrated device according to claim 1 wherein said first diffusion junction comprises a body-drain junction of a power MOS transistor.

7. The integrated device according to claim 1 wherein said at least one second diffusion comprises a region containing control circuitry for the at least one power transistor.

8. An integrated device comprising:

at least one power transistor having a first diffusion defining a first diffusion junction;

an edge termination including a high voltage ring extension implanted region partially overlapping said first diffusion and extending along at least part of a perimeter of the integrated device; and at least one second diffusion of a same type as said first diffusion also partially overlapped by said high voltage ring extension implanted region;

said high voltage ring extension implanted region having at least one interruption therein being slanted by an angle between 30° and 60° from orthogonal to said high voltage ring extension implanted region.

9. The integrated device according to claim 8 wherein said at least one interruption is slanted by an angle of 45°.

10. The integrated device according to claim 8 further comprising a monocrystalline semiconductor substrate and an epitaxial layer thereon defining a region of lesser dopant within said at least one interruption.

11. The integrated device according to claim 8 wherein said first diffusion junction comprises a base-collector junction of a bipolar junction power transistor.

12. The integrated device according to claim 8 wherein said first diffusion junction comprises a body-drain junction of a power MOS transistor.

13. The integrated device according to claim 8 wherein said at least one second diffusion comprises a region containing control circuitry for the at least one power transistor.

14. A method for making an integrated device comprising:

forming at least one power transistor having a first diffusion defining a first diffusion junction;

forming an edge termination including a high voltage ring extension implanted region partially overlapping the first diffusion and extending along at least part of a perimeter of the integrated device;

forming at least one second diffusion of a same type as the first diffusion also partially overlapped by the high voltage ring extension implanted region; and forming at least one slanted interruption from orthogonal to said high voltage ring extension implanted region.

15. The method according to claim 14 wherein the at least one interruption is slanted by an angle between 30° and 60°.

16. The method according to claim 14 wherein the at least one interruption is slanted by an angle of 45°.

17. The method according to claim 14 further comprising a monocrystalline semiconductor substrate and an epitaxial layer thereon defining a region of lesser dopant within the at least one interruption.

18. The method according to claim 14 wherein the first diffusion junction comprises a base-collector junction of a bipolar junction power transistor.

19. The method according to claim 14 wherein the first diffusion junction comprises a body-drain junction of a power MOS transistor.

20. The method according to claim 14 wherein the at least one second diffusion comprises a region containing control circuitry for the at least one power transistor.

* * * * *

UNITED STATES PATENT AND TRADEMARK OFFICE

CERTIFICATE OF CORRECTION

PATENT NO. : 7,675,135 B2
APPLICATION NO. : 11/575227
DATED : March 9, 2010
INVENTOR(S) : Patti et al.

It is certified that error appears in the above-identified patent and that said Letters Patent is hereby corrected as shown below:

| | |
|---|---|
| Column 1, Line 45 | Delete: “$P_{13}$tub”<br>Insert: --P_tub-- |
| Column 2, Line 46 | Delete: “prevent”<br>Insert: --prevents-- |
| Column 4, Line 2 | Insert: --a-- |
| Column 4, Line 5 | Delete: “$P_{13}$tub”<br>Insert: --P_tub1-- |
| Column 4, Line 35 | Delete: “are”<br>Insert: --is-- |

Signed and Sealed this

Thirteenth Day of July, 2010

David J. Kappos

*Director of the United States Patent and Trademark Office*